(12) United States Patent
Yamane et al.

(10) Patent No.: US 8,842,465 B2
(45) Date of Patent: Sep. 23, 2014

(54) MEMORY ELEMENT AND MEMORY APPARATUS

(71) Applicant: Sony Corporation, Tokyo (JP)

(72) Inventors: Kazutaka Yamane, Kanagawa (JP);
Masanori Hosomi, Tokyo (JP);
Hiroyuki Ohmori, Kanagawa (JP);
Kazuhiro Bessho, Kanagawa (JP);
Yutaka Higo, Kanagawa (JP); Tetsuya Asayama, Tokyo (JP); Hiroyuki Uchida, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/675,328

(22) Filed: Nov. 13, 2012

(65) Prior Publication Data

US 2013/0163314 A1    Jun. 27, 2013

(30) Foreign Application Priority Data

Dec. 1, 2011   (JP) .................................. 2011-263508

(51) Int. Cl.
*G11C 11/15*       (2006.01)
*G11C 11/16*       (2006.01)

(52) U.S. Cl.
CPC .................................... *G11C 11/161* (2013.01)
USPC ............................ 365/158; 365/148; 365/171

(58) Field of Classification Search
USPC .......................................... 365/158, 148, 171
See application file for complete search history.

(56) References Cited

U.S. PATENT DOCUMENTS

| | | | |
|---|---|---|---|
| 6,256,223 B1 | 7/2001 | Sun | |
| 7,932,571 B2 | 4/2011 | Rizzo et al. | |
| 8,513,751 B2 | 8/2013 | Asao | |
| 8,519,495 B2 | 8/2013 | Jin et al. | |
| 8,637,947 B2 | 1/2014 | Yamane et al. | |
| 8,699,264 B2 | 4/2014 | Yamane et al. | |

(Continued)

FOREIGN PATENT DOCUMENTS

| | | |
|---|---|---|
| JP | 2003-017782 A | 1/2003 |
| JP | 2008-227388 A | 9/2008 |

OTHER PUBLICATIONS

Berger, "Emission of spin waves by a magnetic multilayer traversed by a current," Physical Review B, Oct. 1, 1996, pp. 9353-9358, vol. 54, No. 13.

(Continued)

*Primary Examiner* — Hoai V Ho
*Assistant Examiner* — Jay Radke
(74) *Attorney, Agent, or Firm* — Wolf, Greenfield & Sacks, P.C.

(57) ABSTRACT

A memory element includes a layered structure. The layered structure includes a memory layer, a magnetization-fixed layer, and an intermediate layer. The memory layer has magnetization perpendicular to a film face in which a direction of the magnetization is changed depending on information, and the direction of the magnetization is changed by applying a current in a lamination direction of the layered structure to record the information in the memory layer. The magnetization-fixed layer has magnetization perpendicular to a film face that becomes a base of the information stored in the memory layer, has a laminated ferri-pinned structure including at least two ferromagnetic layers and a non-magnetic layer, and includes an anti-ferromagnetic oxide layer formed on any of the at least two ferromagnetic layers. The intermediate layer is formed of a non-magnetic material and is provided between the memory layer and the magnetization-fixed layer.

4 Claims, 7 Drawing Sheets

(56) References Cited

U.S. PATENT DOCUMENTS

| | | | |
|---|---|---|---|
| 2002/0101692 A1* | 8/2002 | Fullerton et al. | 360/324.2 |
| 2005/0036361 A1 | 2/2005 | Fukuzumi | |
| 2007/0242502 A1 | 10/2007 | Hosomi et al. | |
| 2008/0019040 A1* | 1/2008 | Zhu et al. | 360/110 |
| 2009/0207724 A1* | 8/2009 | Yanagi et al. | 369/283 |
| 2013/0140658 A1 | 6/2013 | Yamane et al. | |
| 2013/0141964 A1 | 6/2013 | Yamane et al. | |
| 2013/0163315 A1 | 6/2013 | Yamane et al. | |

OTHER PUBLICATIONS

Slonczewski, "Current-driven excitation of magnetic multilayers," Journal of Magnetism and Magnetic Materials, Jan. 1996, pp. L1-L7.

Mangin et al., "Current-induced magnetization reversal in nanopillars with perpendicular anisotrophy," Nature Materials, Feb. 19, 2006, pp. 210-215, vol. 5, Nature Publishing Group.

Parkin, Systematic Variation of the Strength and Oscillation Period of Indirect Magnetic Exchange Coupling through the $3d$, $4d$ and $5d$ Transition Metals. Physical Review Letters. Dec. 16, 1991;67(25):3598-3601.

* cited by examiner

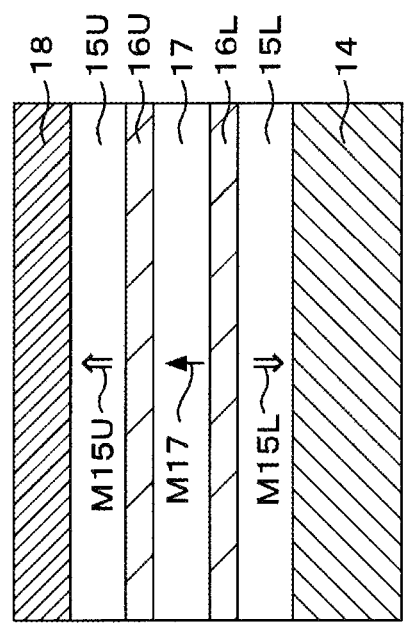
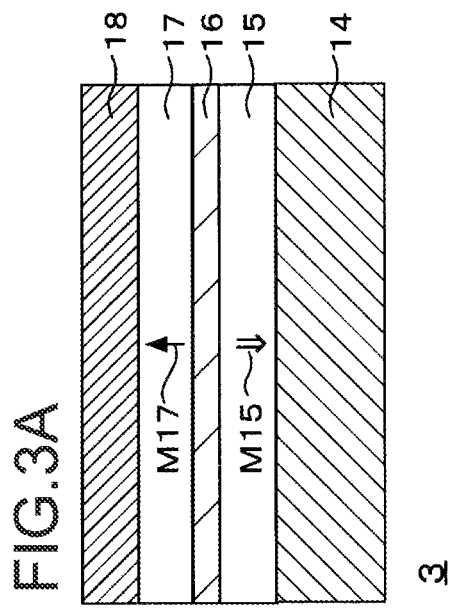
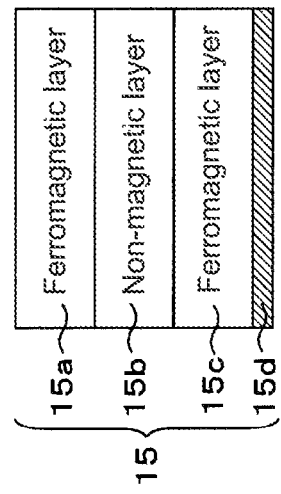
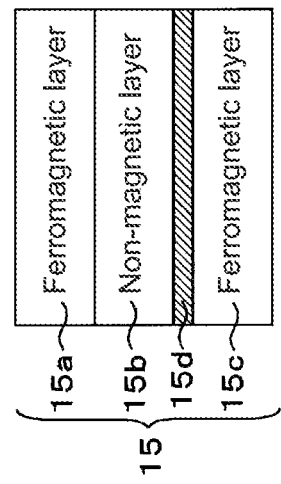
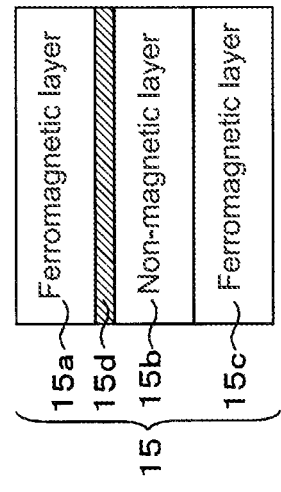

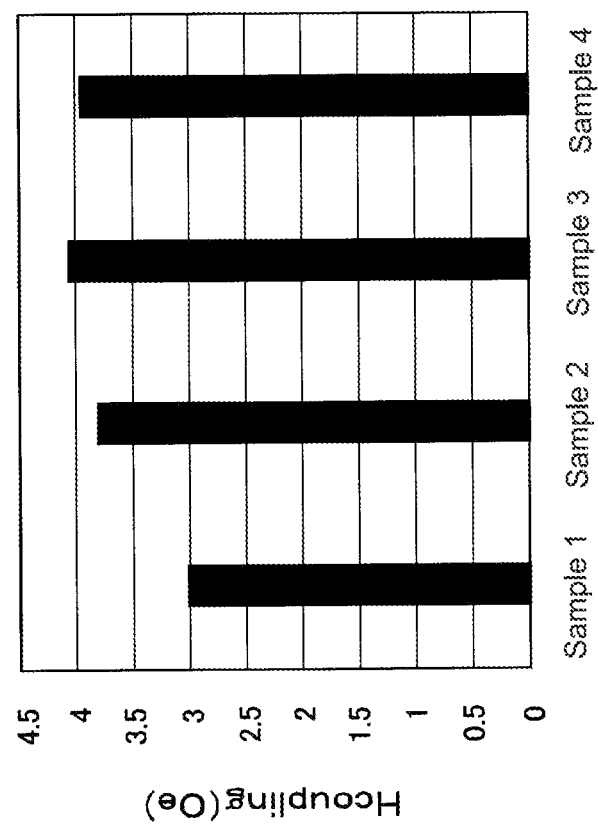

MEMORY ELEMENT AND MEMORY APPARATUS

CROSS REFERENCE TO RELATED APPLICATIONS

This application claims priority to Japanese Priority Patent Application JP 2011-263508, filed in the Japan Patent Office on Dec. 1, 2011, the entire content of which is hereby incorporated by reference.

BACKGROUND

The present disclosure relates to a memory element and a memory apparatus that have a plurality of magnetic layers and make a record using a spin torque magnetization switching.

Along with a rapid development of various information apparatuses from mobile terminals to large capacity servers, further high performance improvements such as higher integration, increases in speed, and lower power consumption have been pursued in elements such as a memory element and a logic element configuring the apparatuses. Particularly, a semiconductor non-volatile memory has significantly progressed, and, as a large capacity file memory, a flash memory is spreading at such a rate that hard disk drives are replaced with the flash memory. Meanwhile, the development of FeRAM (Ferroelectric Random Access Memory), MRAM (Magnetic Random Access Memory), PCRAM (Phase-Change Random Access Memory), or the like has progressed as a substitute for the current NOR flash memory, DRAM or the like in general use, in order to use them for code storage or as a working memory. A part of these is already in practical use.

Among them, the MRAM performs the data storage using a magnetization direction of a magnetic material so that high speed and nearly unlimited ($10^{15}$ times or more) rewriting can be made, and therefore has already been used in fields such as industrial automation and an airplane. The MRAM is expected to be used for code storage or a working memory in the near future due to the high-speed operation and reliability. However, the MRAM has challenges related to lowering power consumption and increasing capacity. This is a basic problem caused by the recording principle of the MRAM, that is, the method of switching the magnetization using a current magnetic field generated from an interconnection.

As a method of solving this problem, a recording method not using the current magnetic field, that is, a magnetization switching method, is under review. Particularly, research on a spin torque magnetization switching has been actively made (for example, see Japanese Unexamined Patent Application Publication Nos. 2003-017782 and 2008-227388, U.S. Pat. No. 6,256,223, Physical Review B, 54, 9353(1996), Journal of Magnetism and Magnetic Materials, 159, L1(1996)).

The memory element using a spin torque magnetization switching often includes an MTJ (Magnetic Tunnel Junction) similarly as the MRAM.

This configuration uses a phenomenon in which, when spin-polarized electrons passing through a magnetic layer which is fixed in an arbitrary direction enter another free (the direction is not fixed) magnetic layer, a torque (which is also called as a spin transfer torque) is applied to the magnetic layer, and the free magnetic layer is switched when a current having a predetermined threshold value or more flows. The rewriting of 0/1 is performed by changing the polarity of the current.

An absolute value of a current for the switching is 1 mA or less in the case of a memory element with a scale of approximately 0.1 μm. In addition, since this current value decreases in proportion to a volume of the element, scaling is possible. In addition, since a word line necessary for the generation of a recording current magnetic field in the MRAM is not necessary, there is an advantage that a cell structure becomes simple.

Hereinafter, the MRAM utilizing a spin torque magnetization switching will be referred to as a Spin Torque-Magnetic Random Access Memory (ST-MRAM). The spin torque magnetization switching is also referred to as a spin injection magnetization switching. Great expectations are put on the ST-MRAM as a non-volatile memory capable of realizing lower power-consumption and larger capacity while maintaining the advantages of the MRAM in which high speed and nearly unlimited rewriting may be performed.

SUMMARY

In the MRAM, writing interconnections (word lines and bit lines) are disposed separately from the memory element, and information is written (recorded) by a current magnetic field generated by applying a current to the writing interconnections. Thus, the current necessary for writing can sufficiently flow through the writing interconnections.

On the other hand, in the ST-MRAM, it is necessary that the current flowing to the memory element induces the spin torque magnetization switching to switch the magnetization direction of the memory layer.

The information is written (recorded) by applying a current directly to the memory element in this manner. In order to select a memory cell to which writing is made, the memory element is connected to a selection transistor to configure the memory cell. In this case, the current flowing to the memory element is limited by the amount of the current that can flow to the selection transistor, i.e., by the saturation current of the selection transistor.

Thus, it is necessary to perform writing with a current equal to or less than the saturation current of the selection transistor, and it is known that the saturation current of the transistor decreases along with miniaturization. In order to miniaturize the ST-MRAM, it is necessary that spin transfer efficiency be improved and the current flowing to the memory element be decreased.

In addition, it is necessary to secure a high magnetoresistance change ratio to amplify a read-out signal. In order to realize this, it is effective to adopt the above-described MTJ structure, that is, to configure the memory element in such a manner that an intermediate layer that comes into contact with the memory layer is used as a tunnel insulating layer (tunnel barrier layer).

In the case where the tunnel insulating layer is used as the intermediate layer, the amount of the current flowing to the memory element is restricted to prevent the insulation breakdown of the tunnel insulating layer from occurring. That is, the current necessary for the spin torque magnetization switching has to be restricted from the viewpoint of securing reliability with respect to repetitive writing of the memory element.

The current necessary for the spin torque magnetization switching is also called as an switching current, a memory current or the like.

Also, since the ST-MRAM is a non-volatile memory, it is necessary to stably store the information written by a current.

That is, it is necessary to secure stability (thermal stability) with respect to thermal fluctuations in the magnetization of the memory layer.

In the case where the thermal stability of the memory layer is not secured, an switched magnetization direction may be re-switched due to heat (temperature in an operational environment), which results in a writing error.

The memory element in the ST-MRAM is advantageous in scaling compared to the MRAM in the related art, that is, advantageous in that the volume of the memory layer can be small, as described above in terms of a recording current value. However, as the volume is small, the thermal stability may be deteriorated as long as other characteristics are the same.

As the capacity increase of the ST-MRAM proceeds, the volume of the memory element becomes smaller, such that it is important to secure the thermal stability.

Therefore, in the memory element of the ST-MRAM, the thermal stability is a significantly important characteristic, and it is necessary to design the memory element in such a manner that the thermal stability thereof is secured even when the volume is decreased.

In other words, in order to provide the ST-MRAM as the non-volatile memory, the switching current necessary for the spin torque magnetization switching is decreased so as not to exceed the saturation current of the transistor or not to break the tunnel barrier. Also, it is necessary to secure the thermal stability for holding the written information.

It is desirable to provide a memory element as an ST-MRAM that sufficiently secures a thermal stability, which is an information holding capacity.

According to an embodiment of the present disclosure, there is provided a memory element, including
a layered structure including
a memory layer having magnetization perpendicular to a film face in which a magnetization direction is changed depending on information,
a magnetization-fixed layer having magnetization perpendicular to a film face that becomes a base of the information stored in the memory layer, and
an intermediate layer that is formed of a non-magnetic material and is provided between the memory layer and the magnetization-fixed layer. The magnetization direction of the memory layer is changed by applying a current in a lamination direction of the layered structure to record the information in the memory layer. In addition, the magnetization-fixed layer has a laminated ferri-pinned structure including at least two ferromagnetic layers and a non-magnetic layer, and includes an anti-ferromagnetic oxide layer formed on any of the at least two ferromagnetic layers.

A memory apparatus according to the embodiment of the present disclosure includes a memory element holding information depending on a magnetization state of a magnetic material, and two types of interconnections intersected each other. The memory element is the one having the configuration as described above, and is disposed between the two types of the interconnections. Through the two types of the interconnections, a current in a lamination direction flows to the memory element.

The memory element according to the embodiment of the present disclosure includes the memory layer holding the information depending on the magnetization state of the magnetic material, and the magnetization-fixed layer formed on the memory layer via the intermediate layer. The information is recorded by switching the magnetization of the memory layer utilizing the spin torque magnetization switching induced by the current flowing in the lamination direction. Therefore, when the current is applied in the lamination direction, the information can be recorded. Since the memory layer is a perpendicular magnetization film, a written current value necessary for switching the magnetization direction of the memory layer can be decreased.

The memory layer including the perpendicular magnetization film is desirable in terms of decreasing the switching current and securing the thermal stability at the same time. For example, Nature Materials., 5, 210(2006) suggests that when the perpendicular magnetization film such as a Co/Ni multilayer film is used for the memory layer, decreasing the switching current and securing the thermal stability can be provided at the same time.

On the other hand, a perpendicular magnetization magnetic material having interfacial magnetic anisotropy is favorably used for the magnetization-fixed layer. In particular, the magnetization-fixed layer in which Co or Fe is included under the intermediate layer (tunnel barrier layer) is favorable to provide a high read-out signal. As the magnetization-fixed layer, a laminated ferri-pinned structure including at least two ferromagnetic layers and a non-magnetic layer may be used.

When the magnetization-fixed layer has the laminated ferri-pinned structure, the asymmetry of the thermal stability in the information writing direction can be easily cancelled and the stability to the spin torque can be improved. Features demanded for the magnetization-fixed layer include high strength of the laminated ferri-coupling when the same magnetic layers are formed.

In this embodiment, in order to achieve the high strength of the laminated ferri-coupling formed by a material having the perpendicular magnetic anisotropy, an anti-ferromagnetic oxide layer is inserted near the non-magnetic layer. The ST-MRAM in which the asymmetry of the thermal stability in the information writing direction is low can be achieved by the magnetization-fixed layer having the high strength of the laminated ferri-coupling.

In addition, according to a configuration of the memory apparatus of the embodiment of the present disclosure, a current in the lamination direction flows through the two types of interconnections to the memory element to induce a spin transfer. Thus, information can be recorded by the spin torque magnetization switching when a current in the lamination direction of the memory element flows through the two types of interconnections.

Also, since the thermal stability of the memory layer can be sufficiently kept and the symmetry of the thermal stability in the information writing direction can be maintained, the information recorded in the memory element can be stably held, the memory apparatus can be miniaturized, reliability can be enhanced, and power consumption can be decreased.

According to the embodiment of the present disclosure, the asymmetry of the thermal stability in the information writing direction can be decreased by the magnetization-fixed layer having the high strength of the laminated ferri-coupling. Therefore, since the thermal stability, which is an information holding capacity, can be sufficiently secured, it is possible to configure the memory element having well-balanced properties.

Thus, operation errors can be eliminated, and operation margins of the memory element can be fully provided. Accordingly, it is possible to realize a memory that stably operates with high reliability.

It is also possible to decrease a writing current and to decrease power consumption when writing into the memory element.

As a result, it is possible to decrease power consumption of the entire memory apparatus.

These and other objects, features and advantages of the present disclosure will become more apparent in light of the following detailed description of best mode embodiments thereof, as illustrated in the accompanying drawings.

BRIEF DESCRIPTION OF DRAWINGS

FIGS. 3A to 3E are each an explanatory view of a configuration of a memory element according to the embodiment;

FIG. 6 is a diagram showing the measurement result of a magnetic field of a laminated ferri-coupling in the experimental samples;

DETAILED DESCRIPTION OF EMBODIMENTS

The embodiment of the present disclosure will be described in the following order.
<1. Configuration of Memory Apparatus according to Embodiment>
<2. General Description of Memory Element according to Embodiment>
<3. Specific Configuration of Embodiment>
<4. Experiment>
<5. Alternative>

1. Configuration of Memory Apparatus According to Embodiment

Firstly, a configuration of a memory apparatus according to an embodiment of the present disclosure will be described.

Figure 1:
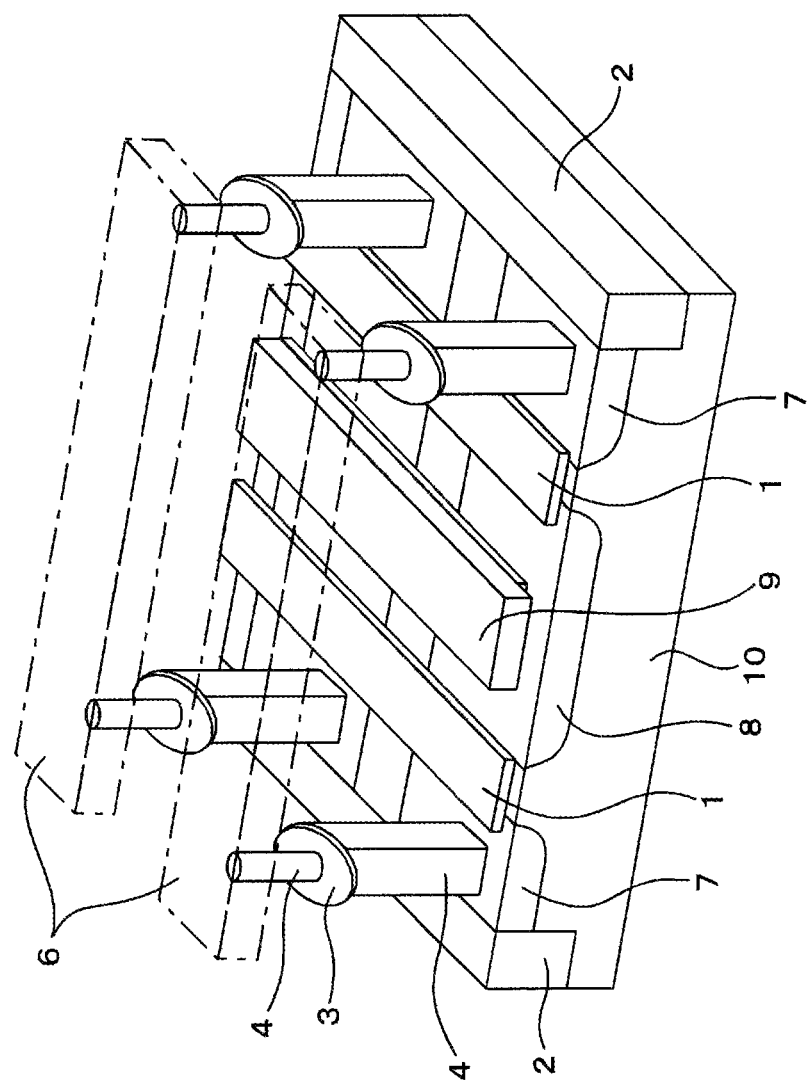
FIG. 1 an explanatory view of a memory apparatus according to an embodiment of the present disclosure.
Figure 2:
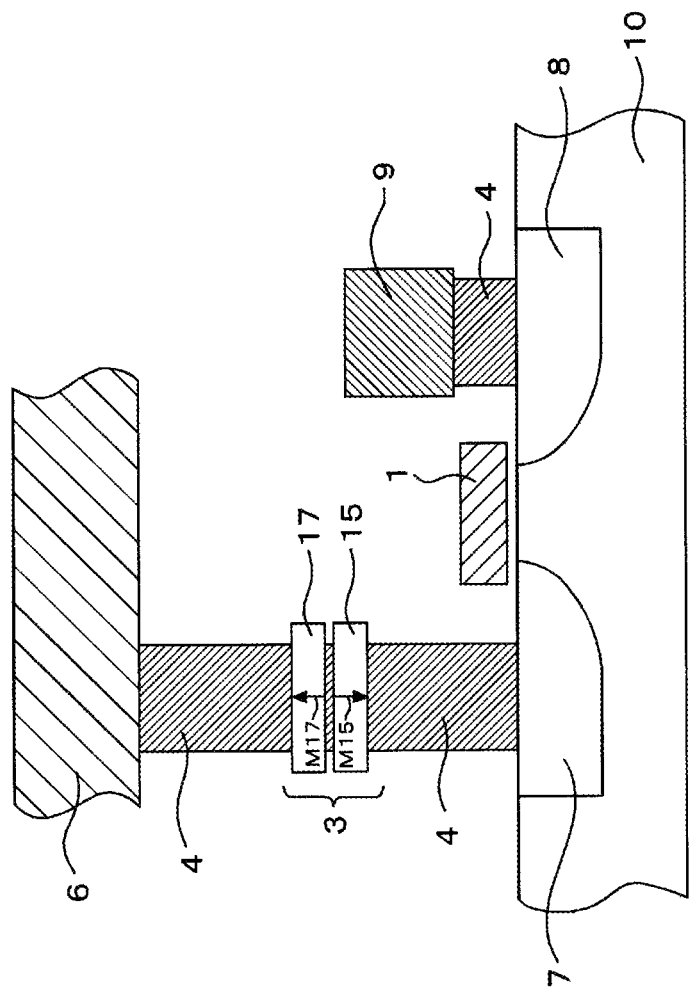
FIG. 2 is a cross-sectional view of the memory apparatus according to the embodiment.

FIGS. 1 and 2 each show a schematic diagram of the memory apparatus according to the embodiment. FIG. 1 is a perspective view and FIG. 2 is a cross-sectional view.

As shown in FIG. 1, in the memory apparatus according to the embodiment, a memory element 3 including an ST-MRAM that can hold information depending on a magnetization state is disposed in the vicinity of an intersection of two kinds of address interconnections (for example, a word line and a bit line) that are perpendicular with each other.

In other words, a drain region 8, a source region 7, and a gate electrode 1 that make up a selection transistor for the selection of each memory apparatus are formed in a semiconductor substrate 10, such as a silicon substrate, at portions isolated by an element isolation layer 2. Among them, the gate electrode 1 functions also as an address interconnection (a word line) extending in the front-back direction in FIG. 1.

The drain region 8 is formed commonly with right and left selection transistors in FIG. 1, and an interconnection 9 is connected to the drain region 8.

The memory element 3 having a memory layer that switches a magnetization direction of by a spin torque magnetization switching is disposed between the source region 7 and a bit line 6 that is disposed at an upper side and extends in the right-left direction in FIG. 1. The memory element 3 is configured with, for example, a magnetic tunnel junction element (MTJ element).

As shown in FIG. 2, the memory element 3 has two magnetic layers 15 and 17. In the two magnetic layers 15 and 17, one magnetic layer is set as a magnetization-fixed layer 15 in which the direction of the magnetization M15 is fixed, and the other magnetic layer is set as a magnetization-free layer in which the direction of the magnetization M17 varies, that is, a memory layer 17.

In addition, the memory element 3 is connected to each bit line 6 and the source region 7 through upper and lower contact layers 4, respectively.

In this manner, when a current in the vertical direction is applied to the memory element 3 through the two types of address interconnections 1 and 6, the direction of the magnetization M17 of the memory layer 17 can be switched by a spin torque magnetization switching.

In such a memory apparatus, it is necessary to perform writing with a current equal to or less than the saturation current of the selection transistor, and it is known that the saturation current of the transistor decreases along with miniaturization. In order to miniaturize the memory apparatus, it is desirable that spin transfer efficiency be improved and the current flowing to the memory element 3 be decreased.

In addition, it is necessary to secure a high magnetoresistance change ratio to amplify a read-out signal. In order to realize this, it is effective to adopt the above-described MTJ structure, that is, to configure the memory element 3 in such a manner that an intermediate layer is used as a tunnel insulating layer (tunnel barrier layer) between the two magnetic layers 15 and 17.

In the case where the tunnel insulating layer is used as the intermediate layer, the amount of the current flowing to the memory element 3 is restricted to prevent the insulation breakdown of the tunnel insulating layer from occurring. That is, it is desirable to restrict the current necessary for the spin torque magnetization switching from the viewpoint of securing reliability with respect to repetitive writing of the memory element 3. The current necessary for the spin torque magnetization switching is also called as an switching current, a memory current or the like.

Also, since the memory apparatus is a non-volatile memory apparatus, it is necessary to stably store the information written by a current. That is, it is necessary to secure stability (thermal stability) with respect to thermal fluctuations in the magnetization of the memory layer.

In the case where the thermal stability of the memory layer is not secured, an switched magnetization direction may be re-switched due to heat (temperature in an operational environment), which results in a writing error.

The memory element 3 (ST-MRAM) in the memory apparatus is advantageous in scaling compared to the MRAM in the related art, that is, advantageous in that the volume of the memory layer can be small. However, as the volume is small, the thermal stability may be deteriorated as long as other characteristics are the same.

As the capacity increase of the ST-MRAM proceeds, the volume of the memory element 3 becomes smaller, such that it is important to secure the thermal stability.

Therefore, in the memory element 3 of the ST-MRAM, the thermal stability is a significantly important characteristic, and it is necessary to design the memory element in such a manner that the thermal stability thereof is secured even when the volume is decreased.

2. General Description of Memory Element According to Embodiment

Then, a general description of the memory element 3 according to the embodiment will be described.

The memory element 3 according to the embodiment records information by switching the magnetization direction of the memory layer by the above-mentioned spin torque magnetization switching.

The memory layer is composed of a magnetic material including a ferromagnetic layer, and holds the information depending on the magnetization state (magnetic direction) of the magnetic material.

The memory element 3 has a layered structure, for example, as shown in FIG. 3A, and includes the memory layer 17 and the magnetization-fixed layer 15 as the at least two ferromagnetic layers, and an intermediate layer 16 disposed between the two magnetic layers.

As shown in FIG. 3B, the memory element 3 may include magnetization-fixed layers 15U and 15L as the at least two ferromagnetic layers, the memory layer 17, and intermediate layers 16U and 16L disposed between the three magnetic layers.

The memory layer 17 has magnetization perpendicular to a film face in which a magnetization direction is changed corresponding to the information.

The magnetization-fixed layer 15 has magnetization perpendicular to a film face that becomes a base of the information stored in the memory layer 17.

The intermediate layer 16 is formed of a non-magnetic material and is provided between the memory layer 17 and the magnetization-fixed layer 15.

By injecting spin polarized ions in a lamination direction of the layered structure having the memory layer 17, the intermediate layer 16 and the magnetization-fixed layer 15, the magnetization direction of the memory layer 17 is changed, whereby the information is stored in the memory layer 17.

Here, the spin torque magnetization switching will be briefly described.

For electrons there are two possible values for spin angular momentum. The states of the spin are defined temporarily as up and down. The numbers of up spin and down spin electrons are the same in the non-magnetic material. But the numbers of up spin and down spin electrons differ in the ferromagnetic material. In two ferromagnetic layers, i.e., the magnetization-fixed layer 15 and the memory layer 17, of the ST-MRAM, the case that the directions of the magnetic moment of each layer are in a reverse direction and the electrons are moved from the magnetization-fixed layer 15 to the memory layer 17 will be considered.

The magnetization-fixed layer 15 is a fixed magnetic layer having the direction of the magnetic moment fixed by high coercive force.

The electrons passed through the magnetization-fixed layer 15 are spin polarized, that is, the numbers of up spin and down spin electrons differs. When the thickness of the intermediate layer 16 that is the non-magnetic layer is made to be sufficiently thin, the electrons reach the other magnetic material, that is, the memory layer 17 before the spin polarization is mitigated by passing through the magnetization-fixed layer 15 and the electrons become a common non-polarized state (the numbers of up spin and down spin electrons are the same) in a non-polarized material.

A sign of the spin polarization in the memory layer 17 is reversed so that a part of the electrons is switched for lowering the system energy, that is, the direction of the spin angular momentum is changed. At this time, the entire angular momentum of the system is necessary to be conserved so that a reaction equal to the total angular momentum change by the electron, the direction of which is changed, is applied also to the magnetic moment of the memory layer 17.

In the case where the current, that is, the number of electrons passed through per unit time is small, the total number of electrons, the directions of which, are changed, becomes small so that the change in the angular momentum occurring in the magnetic moment of the memory layer 17 becomes small, but when the current is increased, it is possible to apply large change in the angular momentum within a unit time.

The time change of the angular momentum with is a torque, and when the torque exceeds a threshold value, the magnetic moment of the memory layer 17 starts a precession, and rotates 180 degrees due to its uniaxial anisotropy to be stable. That is, the switching from the reverse direction to the same direction occurs.

When the magnetization directions are in the same direction and the electrons are made to reversely flow from the memory layer 17 to the magnetization-fixed layer 15, the electrons are then reflected at the magnetization-fixed layer 15. When the electrons that are reflected and spin-switched enter the memory layer 17, a torque is applied and the magnetic moment is switched to the reverse direction. However, at this time, the amount of current necessary for causing the switching is larger than that in the case of switching from the reverse direction to the same direction.

The switching of the magnetic moment from the same direction to the reverse direction is difficult to intuitively understand, but it may be considered that the magnetization-fixed layer 15 is fixed such that the magnetic moment is not switched, and the memory layer 17 is switched for conserving the angular momentum of the entire system. Thus, the recording of 0/1 is performed by applying a current having a predetermined threshold value or more, which corresponds to each polarity, from the magnetization-fixed layer 15 to the memory layer 17 or in a reverse direction thereof.

Reading of information is performed by using a magnetoresistive effect similarly to the MRAM in the related art. That is, as is the case with the above-described recording, a current is applied in a direction perpendicular to the film face. Then, a phenomenon in which an electrical resistance shown by the element varies depending on whether or not the magnetic moment of the memory layer 17 is the same or reverse direction to the magnetic moment of the magnetization-fixed layer 15 is used.

A material used for the intermediate layer 16 between the magnetization-fixed layer 15 and the memory layer 17 may be a metallic material or an insulating material, but the insulating material may be used for the intermediate layer to obtain a relatively high read-out signal (resistance change ratio), and to realize the recording by a relatively low current. The element at this time is called a ferromagnetic tunnel junction (Magnetic Tunnel Junction: MTJ) element.

A threshold value Ic of the current necessary to reverse the magnetization direction of the magnetic layer by the spin torque magnetization switching is different depending on whether an easy axis of magnetization of the magnetic layer is an in-plane direction or a perpendicular direction.

Although the memory element according to the embodiment has perpendicular magnetization, in a memory element having an in-plane magnetization in the related art, the switching current for switching the magnetization direction of the magnetic layer is represented by Ic_para. When the direction is switched from the same direction to the reverse direction, the equation holds, $$Ic\_para = (A \cdot \alpha \cdot Ms \cdot V/g(0)/P)(Hk + 2\pi Ms).$$

When the direction is switched from the reverse direction to the same direction, the equation holds, $$Ic\_para = -(A \cdot \alpha \cdot Ms \cdot V/g(\pi)/P)(Hk + 2\pi Ms).$$

The same direction and the reverse direction denote the magnetization directions of the memory layer based on the magnetization direction of the magnetization-fixed layer, and are also referred to as a parallel direction and a non-parallel direction, respectively.

On the other hand, in the memory element having perpendicular magnetization according to the embodiment, the switching current is represented by Ic_perp. When the direction is switched from the same direction to the reverse direction, the equation holds, $$Ic\_perp = (A \cdot \alpha \cdot Ms \cdot V/g(0)/P)(Hk - 4\pi Ms)$$

When the direction is switched from the reverse direction to the same direction, the equation holds, $$Ic\_perp = -(A \cdot \alpha \cdot Ms \cdot V/g(\pi)/P)(Hk - 4\pi Ms)$$

where A represents a constant, α represents a damping constant, Ms represents a saturation magnetization, V represents an element volume, P represents a spin polarizability, g(0) and g(π) represent coefficients corresponding to efficiencies of the spin torque transmitted to the other magnetic layer in the same direction and the reverse direction, respectively, and Hk represents the magnetic anisotropy.

In the respective equations, when the term (Hk−4πMs) in the perpendicular magnetization type is compared with the term (Hk+2πMs) in the in-plane magnetization type, it can be understood that the perpendicular magnetization type is suitable to decrease a recording current.

Here, a relationship between an switching current Ic0 and a thermal stability index A is represented by the following [Equation 1].

$$I_C 0 = \left(\frac{4 e k_B T}{\hbar}\right)\left(\frac{\alpha \Delta}{\eta}\right)$$

where e represents an electron charge, η represents spin injection efficiency, h with bar represents a reduced Planck constant, α represents a damping constant, $k_B$ represents Boltzmann constant, and T represents a temperature.

According to the embodiment, the memory element includes the magnetic layer (memory layer 17) capable of holding the information depending on the magnetization state, and the magnetization-fixed layer 15 in which the magnetization direction is fixed.

The memory element has to hold the written information to function as a memory. An index of ability to hold the information is the thermal stability index $\Delta(=KV/k_B T)$. The Δ is represented by the (Equation 2).

$$\Delta = \frac{KV}{k_B T} = \frac{M_S V H_K}{2 k_B T}$$

where Hk represents an effective anisotropic magnetic field, $k_B$ represents Boltzmann constant, T represents a temperature, Ms represents a saturated magnetization amount, V represents a volume of the memory layer, and K represents the anisotropic energy.

The effective anisotropic mangetic field Hk is affected by a shape magnetic anisotropy, an induced magnetic anisotropy, a crystal magnetic anisotropy and the like. Assuming a single-domain coherent rotation model, the Hk will be equal to coercive force.

The thermal stability index A and the threshold value Ic of the current have often the trade-off relationship. Accordingly, in order to maintain the memory characteristics, the trade-off often becomes an issue.

In practice, in a circle TMR element having, for example, the memory layer 17 with a thickness of 2 nm and a plane pattern with a diameter of 100 nm, the threshold value of the current to change the magnetization state of the memory layer is about a hundred to hundreds μA.

In contrast, in the MRAM in the related art for switching the magnetization using a current magnetic field, the written current exceeds several mA.

Accordingly, in the ST-MRAM, the threshold value of the written current becomes sufficiently low, as described above. It can be effective to decrease the power consumption of the integrated circuit.

In addition, since the interconnections for generating the current magnetic field generally used in the MRAM in the related art are unnecessary, the ST-MRAM is advantageous over the MRAM in the related art in terms of the integration.

When the spin torque magnetization switching is induced, a current is applied directly into the memory element to write (record) the information. In order to select a memory cell to which writing is made, the memory element is connected to a selection transistor to configure the memory cell.

In this case, the current flowing to the memory element is limited by the amount of the current that can flow to the selection transistor, i.e., by the saturation current of the selection transistor.

In order to decrease the recording current, the perpendicular magnetization is desirably used, as described above. Also, the perpendicular magnetization can generally provide higher magnetic anisotropy than the in-plane magnetization type, and therefore is desirable in that the Δ is kept greater.

Examples of the magnetic material having the perpendicular anisotropy include rare earth—transition metal alloys (such as TbCoFe), metal multilayer films (such as a Co/Pd multilayer film), ordered alloys (such as FePt), those utilizing interfacial magnetic anisotropy between an oxide and a magnetic metal (such as Co/MgO) and the like. When the rare earth—transition metal alloys are diffused and crystallized by being heated, the perpendicular magnetic anisotropy is lost, and therefore the rare earth—transition metal alloys are not desirable as an ST-MRAM material.

It is known that also the metal multilayer film is diffused when being heated, and the perpendicular magnetic anisotropy is degraded. Since the perpendicular magnetic anisotropy is developed when the metal multilayer film has a face-centered cubic (111) orientation, it may be difficult to realize a (001) orientation necessary for a high polarizability layer including MgO, and Fe, CoFe and CoFeB disposed adjacent to MgO. L10 ordered alloy is stable even at high temperature and shows the perpendicular magnetic anisotropy in the (001) orientation. Therefore, the above-mentioned problem is not induced. However, the L10 ordered alloy has to be heated at sufficiently high temperature of 500° C. or more during the production, or atoms should be arrayed regularly by being heated at a high temperature of 500° C. or more after the production. It may induce undesirable diffusion or an increase in interfacial roughness in other portions of a laminated film such as a tunnel barrier.

In contrast, the material utilizing interfacial magnetic anisotropy, i.e., the material including MgO as the tunnel barrier and a Co or Fe material laminated thereon hardly induces any of the above-mentioned problems, and is therefore highly expected as the memory layer material of the ST-MRAM.

On the other hand, a perpendicular magnetization magnetic material having interfacial magnetic anisotropy is favorably used for the magnetization-fixed layer 15. In particular, the magnetization-fixed layer 15 in which Co or Fe is included under the intermediate layer (for example, MgO layer) that is the tunnel barrier is favorable to provide a high read-out signal. The magnetization-fixed layer 15 may be a single-layer or may have a laminated ferri-pinned structure including at least two ferromagnetic layers and a non-magnetic layer may be used. Typically, the laminated ferri-pinned structure including at least two ferromagnetic layers and a non-magnetic layer (Ru) is used.

The advantages of the magnetization-fixed layer 15 having the laminated ferri-pinned structure include that the asymmetry of the thermal stability in the information writing direction can be easily cancelled and that the stability to the spin torque can be improved.

Features demanded for the magnetization-fixed layer 15 include high strength of the laminated ferri-coupling when the same magnetic layers are formed.

The studies by the inventors have revealed that, in order to achieve the high strength of the laminated ferri-coupling formed by a material having the perpendicular magnetic anisotropy, it is important to insert an anti-ferromagnetic oxide layer into the ferromagnetic layer of the magnetization-fixed layer 15.

Specifically, the magnetization-fixed layer 15 has a laminated ferri-pinned structure of the ferromagnetic layer of the perpendicular magnetization film/the non-magnetic layer/the ferromagnetic layer of the perpendicular magnetization film. Then, an anti-ferromagnetic oxide layer is formed on any of the ferromagnetic layers.

For example, the magnetization-fixed layer 15 has a structure of the perpendicular magnetization film/the non-magnetic layer/the anti-ferromagnetic oxide layer/a material having the perpendicular magnetic anisotropy arising from the interfacial magnetic anisotropy, i.e., Co—Fe—B.

Alternatively, the magnetization-fixed layer 15 has a structure of the anti-ferromagnetic oxide layer/the perpendicular magnetization film/the non-magnetic layer/a material having the perpendicular magnetic anisotropy arising from the interfacial magnetic anisotropy, i.e., Co—Fe—B.

These increase the strength of the laminated ferri-coupling.

In the embodiment, the memory layer 17 is a perpendicular magnetization film of Co—Fe—B.

In view of the saturated current value of the selection transistor, as the non-magnetic intermediate layer 16 between the memory layer 17 and the magnetization-fixed layer 15, the magnetic tunnel junction (MTJ) element is configured using the tunnel insulating layer including an insulating material.

The magnetic tunnel junction (MTJ) element is configured by using the tunnel insulating layer, such that it is possible to make a magnetoresistance change ratio (MR ratio) high compared to a case where a giant magnetoresistive effect (GMR) element is configured by using a non-magnetic conductive layer, and therefore it is possible to increase read-out signal strength.

In particular, when magnesium oxide (MgO) is used as the material of the intermediate layer 16 as the tunnel insulating layer, it is possible to make the magnetoresistance change ratio (MR ratio) high.

In addition, generally, the spin transfer efficiency depends on the MR ratio, and as the MR ratio is high, the spin transfer efficiency is improved, and therefore it is possible to decrease the magnetization switching current density.

Therefore, when magnesium oxide is used as the material of the tunnel insulating layer and the memory layer 17 is used, it is possible to decrease the writing threshold current by the spin torque magnetization switching and therefore it is possible to perform the writing (recording) of information with a small current. In addition, it is possible to increase the read-out signal strength.

In this manner, it is possible to decrease the writing threshold current by the spin torque magnetization switching by securing the MR ratio (TMR ratio), and it is possible to perform the writing (recording) of information with a small current. In addition, it is possible to increase the read-out signal strength.

As described above, in the case where the tunnel insulating layer is formed of the magnesium oxide (MgO) film, it is desirable that the MgO film be crystallized and a crystal orientation be maintained in the (001) direction.

In this embodiment, in addition to a configuration formed of the magnesium oxide, the intermediate layer 16 (tunnel insulating layer) disposed between the memory layer 17 and the magnetization-fixed layer 15 may be configured by using, for example, various insulating materials, dielectric materials, and semiconductors such as aluminum oxide, aluminum nitride, $SiO_2$, $Bi_2O_2$, $MgF_2$, CaF, $SrTiO_2$, $AlLaO_2$, and Al—N—O.

An area resistance value of the tunnel insulating layer has to be controlled to several tens $\Omega\mu m^2$ or less from the viewpoint of obtaining a current density necessary for switching the magnetization direction of the memory layer 17 by the spin torque magnetization switching.

In the tunnel insulating layer including the MgO film, the thickness of the MgO film has to be set to 1.5 nm or less so that the area resistance value is in the range described above.

Adjacent to the memory layer 17, a cap layer 18 is disposed. The cap layer 18 includes Ta or Ru, for example, and the interface of the cap layer 18, which comes into contact with the memory layer 17, may include an oxide. As the oxide of the cap layer 18, MgO, aluminum oxide, $TiO_2$, $SiO_2$, $Bi_2O_3$, $SrTiO_2$, $AlLaO_3$, and Al—N—O may be used, for example.

In addition, it is desirable to make the memory element 3 small in size to easily switch the magnetization direction of the memory layer 17 with a small current.

Therefore, the area of the memory element 3 is desirably set to 0.01 $\mu m^2$ or less.

In addition, a non-magnetic element may be added to the memory layer 17.

When heterogeneous elements are added, there is obtained an effect such as improvement in a heat resistance or increase in a magnetoresistive effect due to the prevention of diffusion, and increase in dielectric strength voltage accompanied with planarization. As a material of this added element, B, C, N, O, F, Mg, Si, P, Ti, V, Cr, Mn, Ni, Cu, Ge, Nb, Ru, Rh, Pd, Ag, Ta, Ir, Pt, Au, Zr, Hf, W, Mo, Re, Os, or an alloy or oxide thereof may be used.

In addition, as the memory layer 17, a ferromagnetic layer with a different composition may be directly laminated. In addition, a ferromagnetic layer and a soft magnetic layer may be laminated, or a plurality of ferromagnetic layers may be laminated through the soft magnetic layer or a non-magnetic layer. In the case of laminating in this manner, it is possible to obtain an effect according to the embodiment of the present disclosure.

In particular, in the case where the plurality of ferromagnetic layers is laminated through the non-magnetic layer, it is possible to adjust the interaction strength between the ferromagnetic layers, and therefore an effect capable of controlling a magnetization switching current not to increase is obtained. As a material of the non-magnetic layer in this case, Ru, Os, Re, Ir, Au, Ag, Cu, Al, Bi, Si, B, C, Cr, Ta, Pd, Pt, Zr, Hf, W, Mo, Nb, or an alloy thereof may be used.

It is desirable that the film thickness of each of the magnetization-fixed layer 15 and the memory layer 17 be 0.5 nm to 30 nm.

Other configuration of the memory element may be the same as the configuration of a memory element that records information by the spin torque magnetization switching in the related art.

The magnetization-fixed layer 15 may be configured in such a manner that the magnetization direction is fixed by only a ferromagnetic layer or by using an antiferromagnetic coupling of an antiferromagnetic layer and a ferromagnetic layer.

As a material of the ferromagnetic layer making up the magnetization-fixed layer 15 having the laminated ferri-pinned structure, Co, CoFe, CoPt, CoFeB, or the like may be used. In addition, as a material of the non-magnetic layer, Ru, Cr, Re, Ir, Os, or the like may be used.

As a material of the antiferromagnetic layer, a magnetic material such as an FeMn alloy, a PtMn alloy, a PtCrMn alloy, an NiMn alloy, an IrMn alloy, NiO, and $Fe_2O_3$ may be exemplified.

In addition, a magnetic characteristic may be adjusted by adding a non-magnetic element such as Ag, Cu, Au, Al, Si, Bi, Ta, B, C, O, N, Pd, Pt, Zr, Ta, Hf, Ir, W, Mo, and Nb to the above-described magnetic materials, or in addition to this, a crystalline structure or various physical properties such as a crystalline property and a stability of a substance may be adjusted.

In addition, in relation to a film configuration of the memory element 3, there is no problem if the memory layer 17 may be disposed at the lower side of the magnetization-fixed layer 15. In other words, the positions of the memory layer 17 and the magnetization-fixed layer 15 are switched different from FIG. 3A.

3. Specific Configuration of Embodiment

Subsequently, a specific configuration of this embodiment will be described.

The memory apparatus includes the memory element 3, which can hold information depending on a magnetization state, disposed in the vicinity of an intersection of two kinds of address interconnections 1 and 6 (for example, a word line and a bit line) that are perpendicular to each other, as shown in FIGS. 1 and 2.

When a current in the vertical direction is applied to the memory element 3 through the two types of address interconnections 1 and 6, the magnetization direction of the memory layer 17 can be switched by the spin torque magnetization switching.

FIGS. 3A and 3B each show an example of the layered structure of the memory element 3 (ST-MRAM) according to the embodiment.

In the memory element 3 having the structure shown in FIG. 3A, the underlying layer 14, the magnetization-fixed layer 15, the intermediate layer 16, the memory layer 17 and the cap layer 18 are laminated in the stated order from the bottom.

In this case, the magnetization-fixed layer 15 is disposed under the memory layer 17 in which the direction of the magnetization M17 is switched by the spin injection.

In regard to the spin injection memory, "0" and "1" of information are defined by a relative angle between the magnetization M17 of the memory layer 17 and the magnetization M15 of the magnetization-fixed layer 15.

The intermediate layer 16 that serves as a tunnel barrier layer (tunnel insulating layer) is provided between the memory layer 17 and the magnetization-fixed layer 15, and an MTJ element is configured by the memory layer 17 and the magnetization-fixed layer 15.

The memory layer 17 is composed of a ferromagnetic material having a magnetic moment in which the direction of the magnetization M17 is freely changed in a direction perpendicular to a film face. The magnetization-fixed layer 15 is composed of a ferromagnetic material having a magnetic moment in which the direction of the magnetization M15 is freely changed in a direction perpendicular to a film face.

Information is stored by the magnetization direction of the memory layer 17 having uniaxial anisotropy. Writing is made by applying a current in the direction perpendicular to the film face, and inducing the spin torque magnetization switching. Thus, the magnetization-fixed layer 15 is disposed under the memory layer 17 in which the magnetization direction is switched by the spin injection, and is to serve as the base of the stored information (magnetization direction) of the memory layer 17.

In the embodiment, Co—Fe—B is used for the memory layer 17 and the magnetization-fixed layer 15.

It should be noted that the memory layer 17 may include the non-magnetic layer in addition to the Co—Fe—B magnetic layer. The non-magnetic layer includes Ta, V, Nb, Cr, W, Mo, Ti, Zr and Hf, for example.

Since the magnetization-fixed layer 15 is the base of the information, the magnetization direction should not be changed by recording or reading-out. However, the magnetization-fixed layer 15 does not necessarily need to be fixed to the specific direction, and only needs to be difficult to move by increasing the coercive force, the film thickness or the magnetic damping constant as compared with the memory layer 17.

The intermediate layer 16 is formed of a magnesium oxide (MgO) layer, for example. In this case, it is possible to make a magnetoresistance change ratio (MR ratio) high.

When the MR ratio is thus made to be high, the spin injection efficiency is improved, and therefore it is possible to decrease the current density necessary for switching the direction of the magnetization M17 of the memory layer 17.

The intermediate layer 16 may be configured by using, for example, various insulating materials, dielectric materials, and semiconductors such as aluminum oxide, aluminum nitride, $SiO_2$, $Bi_2O_3$, $MgF_2$, CaF, $SrTiO_2$, $AlLaO_3$, and Al—N—O, as well as magnesium oxide.

As the underlying layer 14 and the cap layer 18, a variety of metals such as Ta, Ti, W, and Ru and a conductive nitride such as TiN can be used. In the underlying layer 14 and the cap layer 18, a single layer may be used or a plurality of layers including different materials may be laminated.

Next, FIG. 3B shows a dual layered structure according to the embodiment.

In the memory element 3, the underlying layer 14, the lower magnetization-fixed layer 15L, the lower intermediate layer 16L, the memory layer 17, the upper intermediate layer 16U, the upper magnetization-fixed layer 15U, and the cap layer 18 are laminated in the stated order from the bottom.

In other words, the memory layer 17 is sandwiched between the magnetization-fixed layers 15U and 15L via the intermediate layers 16U and 16L.

In such a dual structure, the magnetization directions of the magnetization-fixed layers 15U and 15L are necessary not to be changed (magnetization M15U of the upper magnetization-fixed layer 15U and magnetization M15L of the lower magnetization-fixed layer 15L are reversely directed).

According to the above-described embodiment shown in FIGS. 3A and 3B, the memory layer 17 of the memory element 3 is configured in such a manner that the magnitude of the effective diamagnetic field that the memory layer 17 receives is smaller than the saturated magnetization amount Ms of the memory layer 17.

In other words, the effective diamagnetic field that the memory layer 17 receives is decreased smaller than the saturated magnetization amount Ms of the memory layer 17 by selecting the ferromagnetic material Co—Fe—B composition of the memory layer 17.

The memory element 3 of the embodiment can be manufactured by continuously forming from the underlying layer 14 to the cap layer 18 in a vacuum apparatus, and then by forming a pattern of the memory element 3 by a processing such as a subsequent etching.

The memory element 3A shown in FIG. 3 has a laminated ferri-pinned structure in which the magnetization-fixed layer 15 has at least two ferromagnetic layers and a non-magnetic layer.

Moreover, the memory element 3 shown in FIG. 3B has a laminated ferri-pinned structure in which at least one of the magnetization-fixed layers 15U and 15L has at least two ferromagnetic layers and a non-magnetic layer.

In both of the examples of FIGS. 3A and 3B, an anti-ferromagnetic oxide layer is formed on the ferromagnetic layer of the magnetization-fixed layer 15.

As the anti-ferromagnetic oxide layer, a layer including Co—O is inserted. This Co—O may be formed by direct sputtering, or may be obtained by oxidizing Co included in the ferromagnetic layer.

FIGS. 3C, 3D, and 3E each show a configuration example of the magnetization-fixed layer 15 according to this embodiment, i.e., an example of a laminated ferri-pinned structure in which an anti-ferromagnetic oxide layer including Co—C is inserted.

FIG. 3C shows an example of the magnetization-fixed layer 15 in which the ferromagnetic layer 15c, the non-magnetic layer 15b, the anti-ferromagnetic oxide layer 15d, and the ferromagnetic layer 15a are laminated in the stated order from the bottom.

FIG. 3D shows an example of the magnetization-fixed layer 15 in which the ferromagnetic layer 15c, the anti-ferromagnetic oxide layer 15d, the non-magnetic layer 15b, and the ferromagnetic layer 15a are laminated in the stated order from the bottom.

FIG. 3E shows an example of the magnetization-fixed layer 15 in which the anti-ferromagnetic oxide layer 15d, the ferromagnetic layer 15c, the non-magnetic layer 15b, and the ferromagnetic layer 15a are laminated in the stated order from the bottom.

In any of the examples of FIGS. 3C, 3D, and 3E, the ferromagnetic layer 15a, which comes into contact with the intermediate layer 16, is the Co—Fe—B magnetic layer, for example. The ferromagnetic layer 15c, which comes into contact with the underlying layer 14, is formed of CoPt, for example.

In the example of FIG. 3C, for example, the anti-ferromagnetic oxide layer 15d (Co—O) may be formed by sputtering after the non-magnetic layer 15b is laminated, or may be formed by oxidizing Co included in the ferromagnetic layer 15a at the interface when the ferromagnetic layer 15a is formed.

Moreover, in the example of FIG. 3D, the anti-ferromagnetic oxide layer 15d may be formed by sputtering after the non-magnetic layer 15c is laminated, or may be formed by oxidizing Co included in the surface of the ferromagnetic layer 15c when the ferromagnetic layer 15c is formed.

Moreover, in the example of FIG. 3E, the anti-ferromagnetic oxide layer 15d may be formed by sputtering before the non-magnetic layer 15c is laminated, or may be formed by oxidizing Co included in the ferromagnetic layer 15c at the interface when the ferromagnetic layer 15c is formed.

It should be noted that the magnetization-fixed layer 15 is the same as those shown in FIGS. 3C, 3D, and 3E in the case where the layered structure is a dual structure shown in FIG. 3B and the lower magnetization-fixed layer 15L has a laminated ferri-pinned structure. In the case where the upper magnetization-fixed layer 15U has a laminated ferri-pinned structure, it is only necessary to turn the layered structures shown in FIGS. 3C, 3D, and 3E upside down.

Since the magnetization-fixed layer 15 has the laminated ferri-pinned structure including the two ferromagnetic layers 15a and 15c and the non-magnetic layer 15b, and the anti-ferromagnetic oxide layer 15d is formed on any of the ferromagnetic layers (15a or 15b), as shown in FIGS. 3C, 3D, and 3E, the strength of the laminated ferri-coupling is increased. Moreover, the ferromagnetic layer 15a, which comes into contact with the intermediate layer 16, is formed of a material having the perpendicular magnetic anisotropy arising from the interfacial magnetic anisotropy, i.e., Co—Fe—B. Also this contributes the increasing effect. Thus, since the strength of the laminated ferri-coupling is increased, the memory element 3 having low asymmetry of the thermal stability can be configured.

According to the above-described embodiment, since the memory layer 17 of the memory element 3 is the perpendicular magnetization film, a writing current necessary for switching the magnetization M17 direction of the memory layer 17 can be decreased.

In particular, since the magnetization-fixed layer 15 has the laminated ferri-pinned structure including the two ferromagnetic layers 15a and 15c, the non-magnetic layer 15b and the anti-ferromagnetic oxide layer 15d, and the ferromagnetic layer 15a is the perpendicular magnetization film of the material having the perpendicular magnetic anisotropy arising from the interfacial magnetic anisotropy, i.e., Co—Fe—B perpendicular magnetic film, the memory element 3 having high strength of the laminated ferri-coupling and low asymmetry of the thermal stability can be configured.

Thus, since the thermal stability, which is an information holding capacity, can be sufficiently secured, it is possible to configure the memory element having well-balanced properties.

In this manner, operation errors can be eliminated, and operation margins of the memory element 3 can be sufficiently obtained, such that it is possible to stably operate the memory element 3.

Accordingly, it is possible to realize a memory that stably operates with high reliability.

It is also possible to decrease a writing current and to decrease power consumption when writing into the memory element 3.

As a result, it is possible to decrease power consumption of the entire memory apparatus in which a memory cell is configured by the memory element 3 of this embodiment.

Therefore, in regard to the memory including the memory element 3 capable of realizing a memory that is excellent in the information holding capacity and stably operates with high reliability, it is possible to decrease the power consumption.

In addition, the memory apparatus that includes the memory element 3 shown in FIG. 3 and has a configuration shown in FIG. 1 has an advantage in that a general semiconductor MOS forming process may be applied when the memory apparatus is manufactured. Therefore, it is possible to apply the memory of this embodiment as a general purpose memory.

4. Experiment

Here, in regard to the configuration of the memory element 3 according to this embodiment shown in FIG. 3, samples were manufactured, and then characteristics thereof were examined.

In an actual memory apparatus, as shown in FIG. 1, a semiconductor circuit for switching or the like is present in addition to the memory element 3, but here, the examination was made on a wafer in which only the magnetization-fixed layer is formed for the purpose of investigating the magnetization switching characteristic of the magnetization-fixed layer 15.

A thermally-oxidized film having a thickness of 300 nm was formed on a silicon substrate having a thickness of 0.725 mm. Samples 1 to 4 of the memory element 3 having the configuration shown in FIG. 3A are formed thereon.

Figure 4:
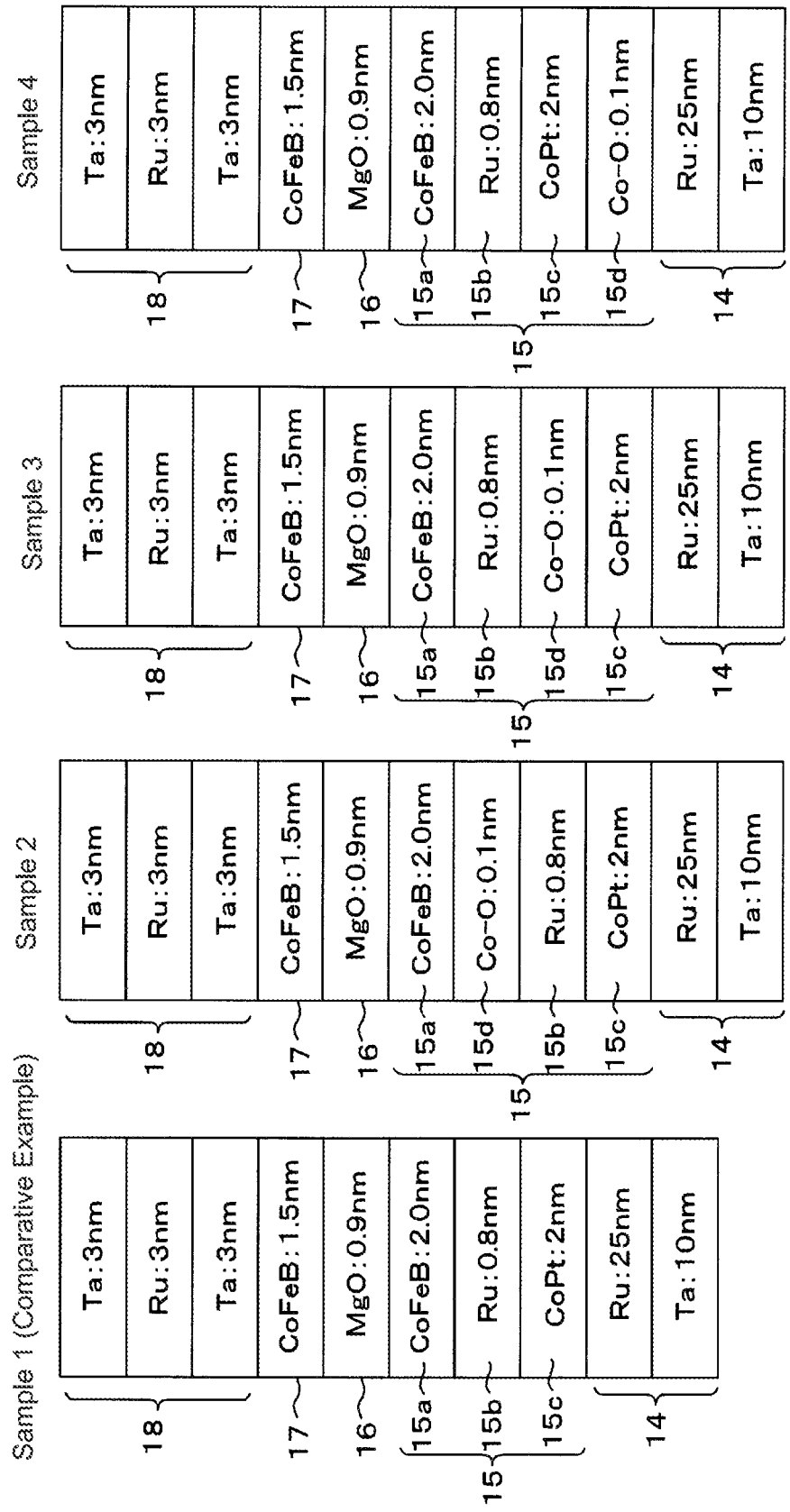
FIG. 4 is an explanatory diagram showing materials and film thicknesses of four experimental samples of memory elements.

FIG. 4 shows the materials and the film thicknesses of the samples 1 to 4. It should be noted that the sample 1 corresponds to a comparative example and the samples 2 to 4 correspond to this embodiment.

All the samples 1 to 4 including the comparative example have the same configuration in terms of the following.

Underlying layer 14: Laminated film of a Ta film having a film thickness of 10 nm and a Ru film having a film thickness of 25 nm Intermediate layer (tunnel insulating layer) 16: Magnesium oxide film having a film thickness of 0.9 nm Memory layer 17: CoFeB layer having a film thickness of 1.5 nm Cap layer 18: Laminated structure of Ta having a film thickness of 3 nm, Ru having a film thickness of 3 nm, and Ta having a film thickness of 3 nm In the samples 1 to 4, the non-magnetic layer 15 is configured as follows.

The ferromagnetic layer 15c, the non-magnetic layer 15b, and the ferromagnetic layer 15a, which form a laminated ferri-pinned structure, have the same configuration in the samples 1 to 4.

Ferromagnetic layer 15c: CoPt having a film thickness of 2 nm

Non-magnetic layer 15b: Ru having a film thickness of 0.8 nm

Ferromagnetic layer 15a: CoFeB having a film thickness of 2 nm

In the sample 1, which is a comparative example, the anti-ferromagnetic oxide layer 15d is not provided.

The sample 2 corresponds to the configuration of FIG. 3C, and Co—O having a film thickness of 0.1 nm is provided on the ferromagnetic layer 15a at the side of the non-magnetic layer 15b to form the anti-ferromagnetic oxide layer 15d.

The sample 3 corresponds to the configuration of FIG. 3D, and Co—O having a film thickness of 0.1 nm is provided on the ferromagnetic layer 15c at the side of the non-magnetic layer 15b to form the anti-ferromagnetic oxide layer 15d.

The sample 4 corresponds to the configuration of FIG. 3E, and Co—O having a film thickness of 0.1 nm is provided on the ferromagnetic layer 15c at the side of the underlying layer 14 to form the anti-ferromagnetic oxide layer 15d.

In each sample, the composition of the Co—Fe—B alloy in each of the magnetization-fixed layer 15 (ferromagnetic layer 15a) and the memory layer 17 was (Co30%-Fe70%) 80%-B20% (all of which is in atm %).

The magnesium oxide (MgO) film of the intermediate layer 16 and Co—O (anti-ferromagnetic oxide layer 15d) of the non-magnetic layer 15 were formed using an RF magnetron sputtering method. Other layers were formed using a DC magnetron sputtering method.

Figure 5A:
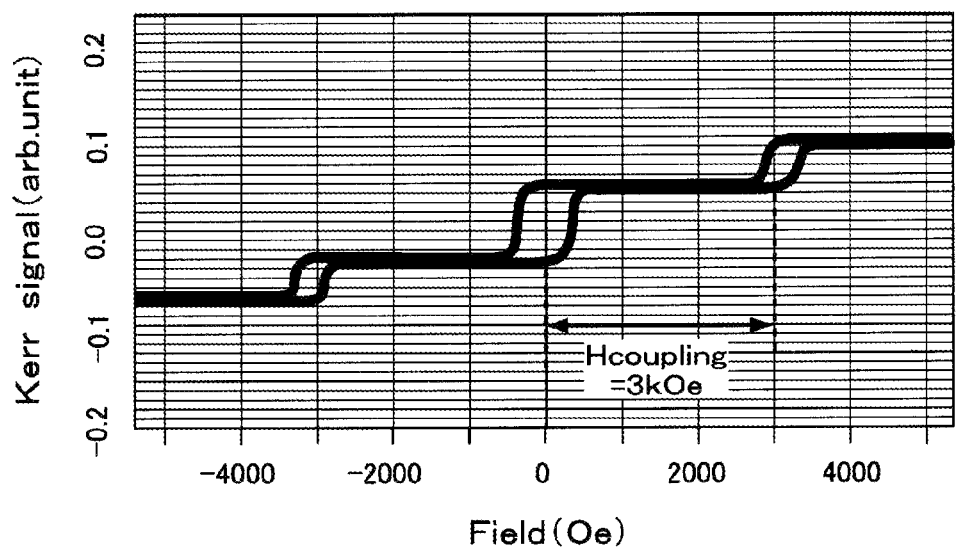
FIGS. 5A and 5B are each a diagram showing the measurement result of magnetooptic Kerr effect of samples 1 and 2 in the experiment.
Figure 5B:
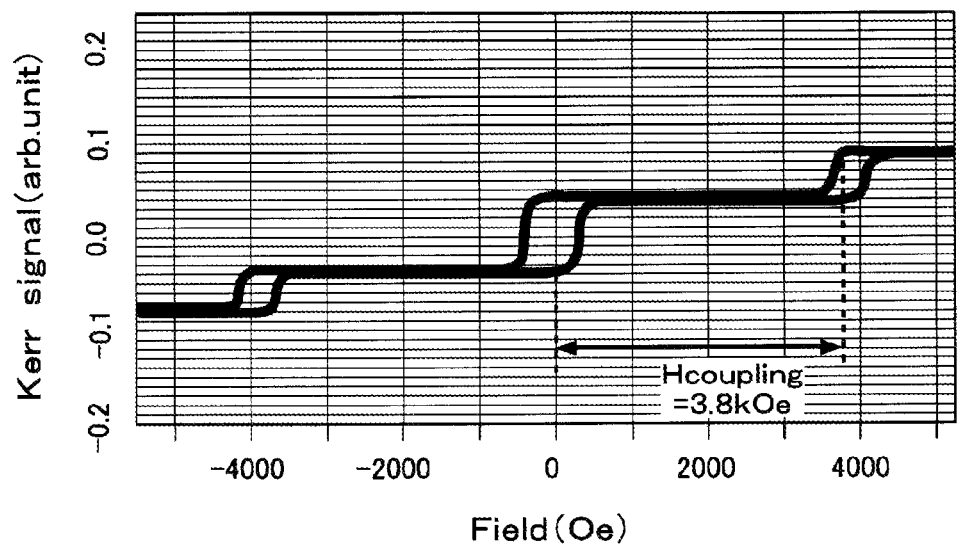

FIGS. 5A and 5B each show the measurement result of the magnetooptic Kerr effect of the sample 1, which is the comparative example, and the measurement result of the magnetooptic Kerr effect of the sample 2 in the embodiment, respectively.

The magnetic field of the laminated ferri-coupling H coupling in the comparative example (sample 1) was 3 kOe. On the other hand, the magnetic field of the laminated ferri-coupling H coupling in the embodiment (sample 2) was 3.8 kOe.

The magnetic field of the laminated ferri-coupling H coupling is defined as a magnetic field in which a laminated ferri-coupling collapses, as shown in the figures.

FIG. 6 shows each of the magnetic field of the laminated ferri-coupling H coupling in the samples 1 to 4.

FIG. 6 reveals that the magnetic field of the laminated ferri-coupling H coupling increases by about 1 kOe in the samples 2 to 4 in which Co—O is inserted into the magnetization-fixed layer 15, compared with the sample 1 in the comparative example.

It can be confirmed that the magnetic field of the laminated ferri-coupling H coupling is increased according to this embodiment, by comparing the FIG. 5A and FIG. 5B described above.

In the samples 2 to 4, Co—O as the anti-ferromagnetic oxide layer 15d is inserted into the top and bottom interfaces of the non-magnetic layer 15b (Ru), or the interface between the ferromagnetic layer 15c (CoPt layer) of the magnetization-fixed layer 15 and the underlying layer 14. In any of the cases, the magnetic field of the laminated ferri-coupling H coupling is increased.

Therefore, it is considered that the magnetic field of the laminated ferri-coupling H coupling is increased even if Co—O is inserted into any of the ferromagnetic layers (CoPt, or CoFeB) of the magnetization-fixed layer 15.

The mechanism in which the magnetic field of the laminated ferri-coupling H coupling is increased by inserting Co—O is considered as follows.

In general, Co—O is known as an anti-ferromagnetic material. For example, an antiferromagnetic coupling is caused on the interface between Co and Co—O. That is, also in this embodiment, an antiferromagnetic coupling between Co and Co—O is caused near the magnetic layer in which Co—O is inserted. This increases the perpendicular magnetic anisotropy partially.

Therefore, it is considered that the perpendicular magnetic anisotropy of the ferromagnetic layer that forms the magnetization-fixed layer 15 is enhanced, which results in an increase in the magnetic field of the laminated ferri-coupling H coupling through Ru.

If the film thickness of Co—O is too thin, anti-ferromagnetic coupling effects are reduced, and if the film thickness of Co—O is too thick, resistance of a film increases. Therefore, the film thickness of Co—O is favorably within a range of 0.05 to 0.3 nm.

In Experiment, although a film that was directly sputtered from a Co—O target was used for Co—O, a Co layer may be formed with Ar+oxygen gas, or a thin Co film may be formed to be oxidized.

5. Alternative

While the embodiment according to the present disclosure has been described, it should be understood that the present disclosure is not limited to the layered structure of the memory element 3 shown in the above-described embodiment, but it is possible to adopt a variety of layered structures.

For example, although the composition of Co—Fe—B in the magnetization-fixed layer 15 and the memory layer 17 is the same in the embodiment, it should be understood that the present disclosure is not limited thereto, various structures may be taken without departing from the scope and spirit of the present disclosure.

Moreover, although the ferromagnetic layer 15a (Co—Fe—B layer) in the magnetization-fixed layer 15 is a single-layer in the embodiment, it is also possible to add an element or an oxide to the ferromagnetic layer 15a unless the coupling magnetic field is significantly decreased.

Examples of elements to be added include Ta, Hf, Nb, Zr, Cr, Ti, V, and W. Examples of oxides to be added include MgO, Al—O, $SiO_2$.

Moreover, the underlying layer 14 and the cap layer 18 may be formed of a single material or may have a configuration in which a plurality of materials are laminated.

Moreover, Co—O is described as an anti-ferromagnetic oxide material to be inserted into the laminated ferri-pinned structure of the magnetization-fixed layer 15, Ni—O, $Cr_2O_3$, $VO_2$ may be used for the anti-ferromagnetic oxide layer 15d.

The memory element 3 according to the embodiment of the present disclosure has a configuration of the magnetoresistive effect element such as a Tunneling Magneto Resistance (TMR) element. The magnetoresistive effect element as the TMR element can be applied to a variety of electronic apparatuses, electric appliances and the like including a magnetic head, a hard disk drive equipped with the magnetic head, an integrated circuit chip, a personal computer, a portable terminal, a mobile phone and a magnetic sensor device as well as the above-described memory apparatus.

Figure 7A:
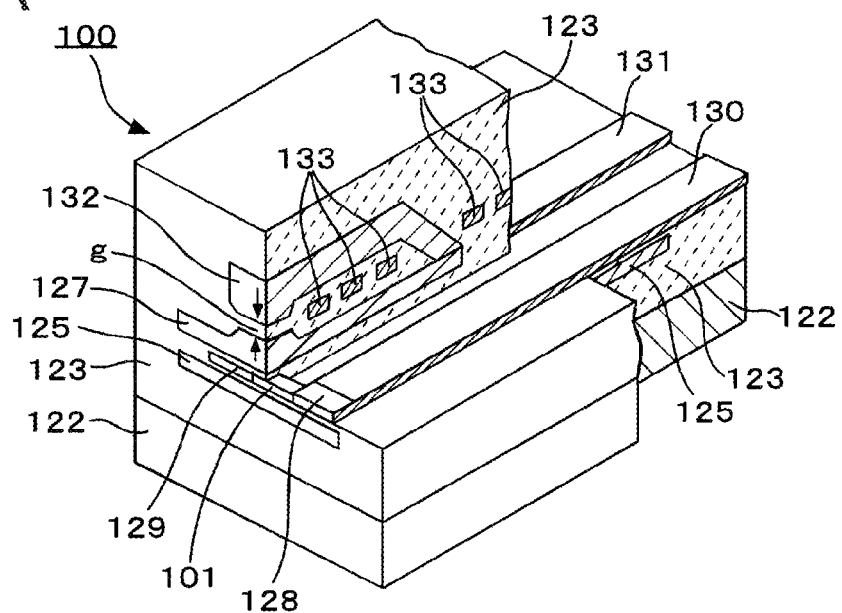
FIGS. 7A and 7B are each an explanatory view of an application of the embodiment to a magnetic head.
Figure 7B:
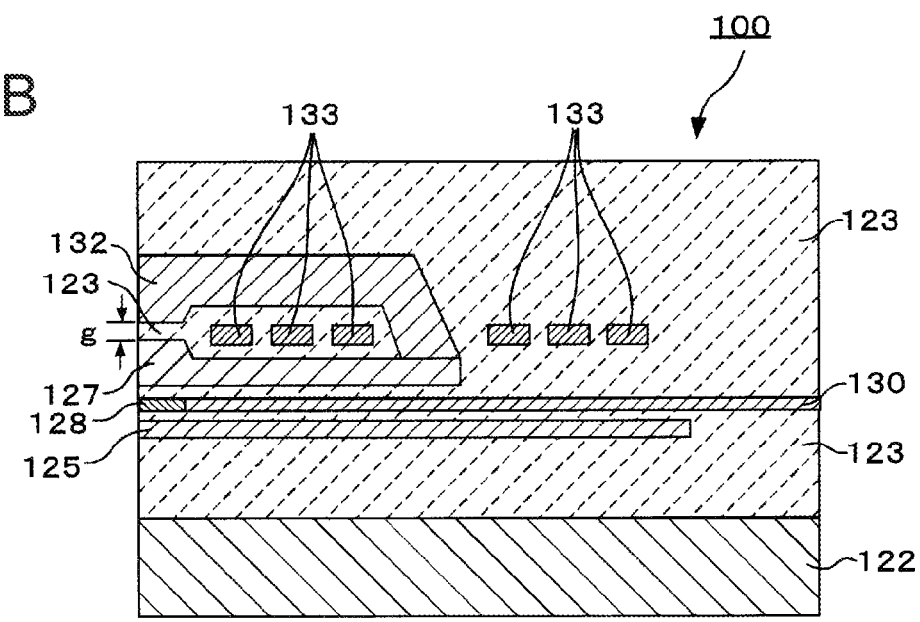

As an example, FIGS. 7A and 7B each show an application of a magnetoresistive effect element 101 having the configuration of the memory element 3 to a composite magnetic head 100. FIG. 7A is a perspective view shown by cutting some parts of the composite magnetic head 100 for discerning the internal configuration. FIG. 7B is a cross-sectional view of the composite magnetic head 100.

The composite magnetic head 100 is a magnetic head used for a hard disk apparatus or the like. On a substrate 122, the magnetoresistive effect magnetic head according to the embodiment of the present disclosure is formed. On the magnetoresistive effect magnetic head, an inductive magnetic head is laminated and thus the composite magnetic head 100 is formed. The magnetoresistive effect magnetic head functions as a reproducing head, and the inductive magnetic head functions as a recording head. In other words, the composite magnetic head 100 is configured by combining the reproducing head and the recording head.

The magnetoresistive effect magnetic head mounted on the composite magnetic head 100 is a so-called shielded MR head, and includes a first magnetic shield 125 formed on the substrate 122 via an insulating layer 123, the magnetoresistive effect element 101 formed on the first magnetic shield 125 via the insulating layer 123, and a second magnetic shield 127 formed on the magnetoresistive effect element 101 via the insulating layer 123. The insulating layer 123 includes an insulation material such as $Al_2O_3$ and $SiO_2$.

The first magnetic shield 125 is for magnetically shielding a lower side of the magnetoresistive effect element 101, and includes a soft magnetic material such as Ni—Fe. On the first magnetic shield 125, the magnetoresistive effect element 101 is formed via the insulating layer 123.

The magnetoresistive effect element 101 functions as a magnetosensitive element for detecting a magnetic signal from the magnetic recording medium in the magnetoresistive effect magnetic head. The magnetoresistive effect element 101 may have the similar film configuration to the above-described memory element 3.

The magnetoresistive effect element 101 is formed in an almost rectangular shape, and has one side that is exposed to an opposite surface of the magnetic recording medium. At both ends of the magnetoresistive effect element 101, bias layers 128 and 129 are disposed. Also, connection terminals 130 and 131 that are connected to the bias layers 128 and 129 are formed. A sense current is supplied to the magnetoresistive effect element 101 through the connection terminals 130 and 131.

Above the bias layers 128 and 129, the second magnetic shield 127 is disposed via the insulating layer 123.

The inductive magnetic head laminated and formed on the above-described magnetoresistive effect magnetic head includes a magnetic core including the second magnetic shield 127 and an upper core 132, and a thin film coil 133 wound around the magnetic core.

The upper core 132 forms a closed magnetic path together with the second magnetic shield 127, is to be the magnetic core of the inductive magnetic head, and includes a soft magnetic material such as Ni—Fe. The second magnetic shield 127 and the upper core 132 are formed such that front end portions of the second magnetic shield 127 and the upper core 132 are exposed to an opposite surface of the magnetic recording medium, and the second magnetic shield 127 and the upper core 132 come into contact with each other at back end portions thereof. The front end portions of the second magnetic shield 127 and the upper core 132 are formed at the opposite surface of the magnetic recording medium such that the second magnetic shield 127 and the upper core 132 are spaced apart by a predetermined gap g.

In other words, in the composite magnetic head 100, the second magnetic shield 127 not only magnetically shields the upper side of the magnetoresistive effect element 101, but functions as the magnetic core of the inductive magnetic head. The second magnetic shield 127 and the upper core 132 configure the magnetic core of the inductive magnetic head. The gap g is to be a recording magnetic gap of the inductive magnetic head.

In addition, above the second magnetic shield 127, thin film coils 133 buried in the insulation layer 123 are formed. The thin film coils 133 are formed to wind around the magnetic core including the second magnetic shield 127 and the upper core 132. Both ends (not shown) of the thin film coils 133 are exposed to the outside, and terminals formed on the both ends of the thin film coil 133 are to be external connection terminals of the inductive magnetic head. In other words, when a magnetic signal is recorded on the magnetic recording medium, a recording current will be supplied from the external connection terminals to the thin film coil 133.

The composite magnetic head 121 as described above is equipped with the magnetoresistive effect magnetic head as the reproducing head. The magnetoresistive effect magnetic head is equipped, as the magnetosensitive element that detects a magnetic signal from the magnetic recording medium, with the magnetoresistive effect element 101 to which the technology according to the present disclosure is applied. As the magnetoresistive effect element 101 to which the technology according to the present disclosure is applied shows the excellent properties as described above, the magnetoresistive effect magnetic head can achieve further high recording density of magnetic recording.

The present disclosure may also have the following configurations.

(1) A memory element, including
a layered structure including
a memory layer that has magnetization perpendicular to a film face in which a direction of the magnetization is changed depending on information, the direction of the magnetization being changed by applying a current in a lamination direction of the layered structure to record the information in the memory layer,
a magnetization-fixed layer that has magnetization perpendicular to a film face that becomes a base of the information stored in the memory layer, has a laminated ferri-pinned structure including at least two ferromagnetic layers and a non-magnetic layer, and includes an anti-ferromagnetic oxide layer formed on any of the at least two ferromagnetic layers, and
an intermediate layer that is formed of a non-magnetic material and is provided between the memory layer and the magnetization-fixed layer.

(2) The memory element according to (1) above, in which
one of the ferromagnetic layers in the magnetization-fixed layer, which comes into contact with the intermediate layer, includes Co—Fe—B as a magnetic material.

(3) The memory element according to (1) or (2) above, in which
the anti-ferromagnetic oxide layer is a Co—O layer.

The present disclosure contains subject matter related to that disclosed in Japanese Priority Patent Application JP 2011-263508 filed in the Japan Patent Office on Dec. 1, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A memory element, comprising:
a layered structure including:
a memory layer that has magnetization perpendicular to a film face in which a direction of the magnetization is changed depending on information, the direction of the magnetization being changed by applying a current in a lamination direction of the layered structure to record the information in the memory layer,
a magnetization-fixed layer that has magnetization perpendicular to a film face that becomes a base of the information stored in the memory layer, has a laminated ferri-pinned structure including at least two ferromagnetic layers and a non-magnetic layer, and includes an anti-ferromagnetic oxide layer formed on a first ferromagnetic layer of the at least two ferromagnetic layers and situated between the first ferromagnetic layer and the non-magnetic layer, and
an intermediate layer that is formed of a non-magnetic material and is provided between the memory layer and the magnetization-fixed layer.

2. The memory element according to claim 1, wherein one of the ferromagnetic layers in the magnetization-fixed layer, which comes into contact with the intermediate layer, includes Co—Fe—B as a magnetic material.

3. The memory element according to claim 1, wherein the anti-ferromagnetic oxide layer is a Co—O layer.

4. A memory apparatus, comprising:
a memory element configured to hold information depending on magnetization state of a magnetic material, which includes a layered structure including:
a memory layer having magnetization perpendicular to a film face in which a direction of the magnetization is changed depending on the information, the direction of the magnetization being changed by applying a current in a lamination direction of the layered structure to record the information in the memory layer,
a magnetization-fixed layer that has magnetization perpendicular to a film face that becomes a base of the information stored in the memory layer, has a laminated ferri-pinned structure including at least two ferromagnetic layers and a non-magnetic layer, and includes an anti-ferromagnetic oxide layer formed on a first ferromagnetic layer of the at least two ferromagnetic layers and situated between the first ferromagnetic layer and the non-magnetic layer, and
an intermediate layer that is formed of a non-magnetic material and is provided between the memory layer and the magnetization-fixed layer,
wherein the layered structure includes an oxide layer, a Co—Fe—B magnetic layer and the non-magnetic layer laminated in the stated order; and
two types of interconnections intersecting each other, sandwiching the memory element, through which the current in the lamination direction flows to the memory element.

* * * * *